(12) United States Patent
Watanabe et al.

(10) Patent No.: US 9,640,720 B2
(45) Date of Patent: May 2, 2017

(54) SURFACE LIGHT-EMISSION ELEMENT USING ZINC OXIDE SUBSTRATE

(71) Applicant: NGK Insulators, Ltd., Nagoya-Shi (JP)

(72) Inventors: Morimichi Watanabe, Nagoya (JP); Katsuhiro Imai, Nagoya (JP); Jun Yoshikawa, Nagoya (JP); Tsutomu Nanataki, Nagoya (JP); Takashi Yoshino, Nagoya (JP); Yukihisa Takeuchi, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 14/737,627

(22) Filed: Jun. 12, 2015

(65) Prior Publication Data

US 2015/0372191 A1    Dec. 24, 2015

Related U.S. Application Data

(63) Continuation of application No. PCT/JP2013/083373, filed on Dec. 12, 2013.

(30) Foreign Application Priority Data

Dec. 14, 2012   (JP) ................................ 2012-273932
May 31, 2013   (JP) ................................ 2013-115753

(51) Int. Cl.
     *H01L 33/16*      (2010.01)
     *H01L 33/28*      (2010.01)
     (Continued)

(52) U.S. Cl.
     CPC .......... *H01L 33/16* (2013.01); *H01L 33/0008* (2013.01); *H01L 33/26* (2013.01);
     (Continued)

(58) Field of Classification Search
     CPC ..... C30B 25/18; C30B 29/16; H01L 33/0087; H01L 21/02403; H01L 21/02414;
     (Continued)

(56) References Cited

U.S. PATENT DOCUMENTS 7,824,955 B2 *   11/2010   White ................. C23C 14/0026
                                                         257/E21.08
2006/0163605 A1    7/2006   Miyahara
                           (Continued)

FOREIGN PATENT DOCUMENTS

JP             51-16316 A      2/1976
JP             3128861 B       1/2001
                 (Continued)

OTHER PUBLICATIONS

International Search Report and Written Opinion (Application No. PCT/JP2013/083373) mailed Feb. 25, 2014.
(Continued)

*Primary Examiner* — Walter H Swanson
(74) *Attorney, Agent, or Firm* — Burr & Brown, PLLC

(57) ABSTRACT

Provided is a surface light-emitting device comprising a substrate composed of an oriented polycrystalline zinc oxide sintered body in a plate shape, a light emitting functional layer provided on the substrate, and an electrode provided on the light emitting functional layer. According to the present invention, a surface light-emitting device having high luminous efficiency can be inexpensively provided.

16 Claims, 3 Drawing Sheets

(51) Int. Cl.
*H01L 33/32* (2010.01)
*H01L 33/26* (2010.01)
*H01L 33/00* (2010.01)

(52) U.S. Cl.
CPC ............ *H01L 33/28* (2013.01); *H01L 33/285* (2013.01); *H01L 33/325* (2013.01); *H01L 33/0083* (2013.01); *H01L 33/0095* (2013.01)

(58) Field of Classification Search
CPC ......... H01L 21/02433; H01L 21/02554; H01L 21/02565; H01L 21/02576; H01L 21/02579; H01L 21/02581
USPC .......................................................... 257/43
See application file for complete search history.

(56) References Cited

U.S. PATENT DOCUMENTS

| | | |
|---|---|---|
| 2006/0183625 A1 | 8/2006 | Miyahara |
| 2011/0062440 A1 | 3/2011 | Adekore et al. |
| 2011/0101373 A1 | 5/2011 | Arena et al. |
| 2011/0136281 A1 | 6/2011 | Sheen |

FOREIGN PATENT DOCUMENTS

| | | |
|---|---|---|
| JP | 2002-121067 A | 4/2002 |
| JP | 2004-359495 A | 12/2004 |
| JP | 4502493 B | 7/2010 |
| JP | 2011-108859 A | 6/2011 |
| JP | 2011-521477 A | 7/2011 |
| JP | 2011-252965 A | 12/2011 |
| WO | 2005/004246 A1 | 1/2005 |
| WO | 2010/036602 A1 | 4/2010 |

OTHER PUBLICATIONS

K. Nakahara et al., "Nitrogen doped $Mg_xZn_{1-x}O$/ZnO single heterostructure ultraviolet light-emitting diodes on ZnO substrates," *Applied Physics Letters* 97, 013501 (2010).

European Search Report, European Application No. 13862186.7, dated Sep. 14, 2016 (6 pages).

\* cited by examiner

SURFACE LIGHT-EMISSION ELEMENT USING ZINC OXIDE SUBSTRATE

FIELD OF THE INVENTION

The present invention relates to a surface light-emitting device including a zinc oxide substrate.

BACKGROUND OF THE INVENTION

In recent years, surface light-emitting EL lightings have been attracting attention as next-generation lightings. Surface light-emitting EL lightings have benefits such as high luminescence uniformity, thinness and space-saving, high designability, and eye-friendly. Although some surface light-emitting EL lightings including organic EL are already commercially available, there are still many challenges for widespread use thereof because of cost and durability. Moreover, in the case where a light emitting diode (LED) is used, the use of an expensive substrate is required, thus posing a problem in that providing large-area devices is difficult.

Meanwhile, zinc oxide (ZnO) is a safe, inexpensive compound semiconductor and is known as a material that is chemically stable and also has excellent transparency. Zinc oxide is mainly used in the form of a sintered body or a powder, and is utilized for sputtering targets, varistors, rubber additives, cosmetics, and the like. In the case where zinc oxide is used as a sintered body, it is known that aligning the crystal orientation of zinc oxide changes its characteristics. For example. Patent Document 1 discloses a crystallographically oriented zinc oxide sintered body with a (101) crystal orientation ratio falling within a predetermined range as a sputtering target. Patent Document 2 discloses a (110)-oriented zinc oxide sintered body.

Furthermore, an application of zinc oxide to light emitting diodes (LEDs) has been investigated, and, for example, Non-Patent Document 1 reports that ultraviolet emission was observed from an LED produced by forming a N-doped $Mg_xZn_{1-x}O$ film on a Zn-polar ZnO single crystal substrate.

CITATION LIST

Patent Documents

Patent Document 1: JP 3128861B
Patent Document 2: JP 4502493B

Non-Patent Document

Non-Patent Document 1: K. Nakahara et al., "Nitrogen doped $Mg_xZn_{1-x}O$/ZnO single heterostructure ultraviolet light-emitting diodes on ZnO substrates", Applied Physics Letters 97, 013501 (2010)

SUMMARY OF THE INVENTION

The inventors have currently found that a surface light-emitting device having high luminous efficiency can be inexpensively provided by using an oriented polycrystalline zinc oxide sintered body in a plate shape as a substrate.

Accordingly, an object of the present invention is to inexpensively provide a surface light-emitting device having high luminous efficiency.

According to an aspect of the present invention, there is provided a surface light-emitting device comprising:

a substrate composed of an oriented polycrystalline zinc oxide sintered body in a plate shape;
a light emitting functional layer provided on the substrate; and
an electrode provided on the light emitting functional layer.

DETAILED DESCRIPTION OF THE INVENTION

Surface Light-Emitting Device

Figure 1:
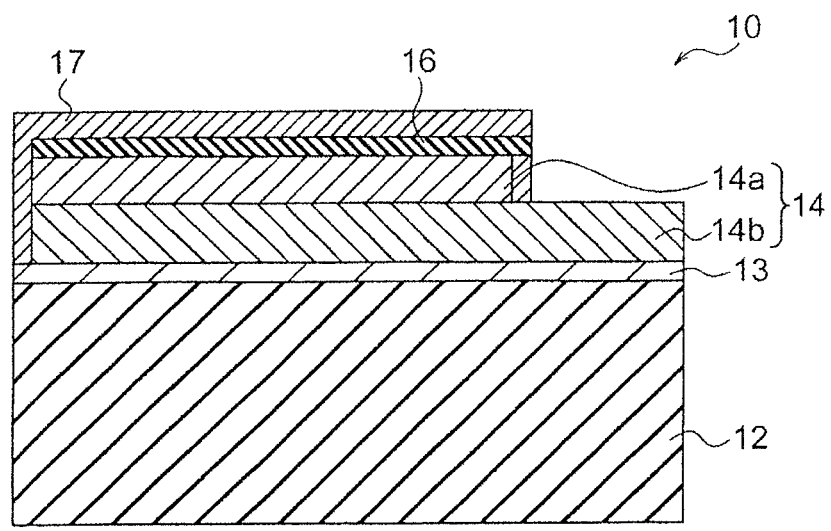
FIG. 1 is a cross-sectional schematic diagram showing one example of the surface light-emitting device of the present invention.

FIG. 1 schematically shows the configuration of a surface light-emitting device according to one aspect of the present invention. A surface light-emitting device 10 shown in FIG. 1 comprises a substrate 12, a light emitting functional layer 14 provided on the substrate, and an electrode 16 provided on the light emitting functional layer.

The substrate 12 is composed of an oriented polycrystalline zinc oxide sintered body that is in a plate shape. Zinc oxide crystal has a hexagonal wurtzite structure, and the oriented polycrystalline zinc oxide sintered body is a solid in which a countless number of zinc oxide crystal grains are bonded to each other by sintering in an oriented manner. Zinc oxide crystal grains contain zinc oxide, and may contain a dopant and an inevitable impurity as other elements or may be composed of zinc oxide and an inevitable impurity. Such other elements may be substituted at the Zn site and the O site of the hexagonal wurtzite structure, may be contained as additive elements that do not constitute the crystal structure, or may exist at grain boundaries. Also, the zinc oxide sintered body may contain another phase or another element as described above in addition to zinc oxide crystal grains, but preferably the zinc oxide sintered body is composed of zinc oxide crystal grains and an inevitable impurity. Nevertheless, the oriented polycrystalline zinc oxide sintered body may be composed of ZnO formed into a mixed crystal with a crystal of one or more selected from the group consisting of MgO, CdO, ZnS, ZnSc, and ZnTe, and, moreover, the oriented polycrystalline zinc oxide sintered body may be doped with an n-type dopant or a p-type dopant so that the substrate 12 functions as an n-type zinc oxide layer or a p-type zinc oxide layer. Preferable examples of n-type dopants include one or more selected from the group consisting of aluminum (Al), gallium (Ga), indium (In), boron (B), fluorine (F), chlorine (Cl), bromine (Br), iodine (I), and silicon (Si). Preferable examples of p-type dopants include one or more selected from the group consisting of nitrogen (N), phosphorus (P), arsenic (As), carbon (C), lithium (Li), sodium (Na), potassium (K), silver (Ag), and copper (Cu). The orientation plane of the oriented zinc oxide sintered body, on which the light emitting functional layer is to be formed, is not particularly limited and may be a c-plane (Zn plane or O plane), a-plane, m-plane, or the like. When zinc oxide, gallium nitride, or the like is used for the light emitting functional layer, influences of spontaneous polarization within the zinc oxide or gallium nitride crystal can be avoided by using an a-plane-oriented or m-plane-oriented zinc oxide sintered body as a film formation surface, and thus luminous efficiency may be further increased.

In any case, the oriented polycrystalline zinc oxide sintered body is composed of a zinc oxide sintered body containing numerous zinc oxide single crystal grains which are to some extent or highly oriented in a certain direction. The polycrystalline zinc oxide sintered body oriented in this way is stronger and less expensive than zinc oxide single crystals and, therefore, enables manufacture of surface light-emitting devices that are significantly less expensive and yet have a larger area than those manufactured by using a single crystal substrate. Moreover, doping control makes it possible to obtain an oriented zinc oxide sintered body having a low resistivity of preferably $1\times10^{-1}$ Ωcm or less, more preferably $1\times10^{-2}$ Ωcm or less, further preferably $1\times10^{-3}$ Ωcm or less. In addition, the use of an oriented polycrystalline zinc oxide sintered body makes it possible to achieve high luminous efficiency as well. In particular, when the constituent layers of the light emitting functional layer 14 is formed by epitaxial growth on the oriented substrate 12, a state in which crystal orientation is aligned in the normal direction can be achieved, and therefore high luminous efficiency comparable to that obtained when a single crystal substrate is used is obtained. Furthermore, depending on the production method, the oriented polycrystalline zinc oxide sintered body may have a low light transmittance due to the presence of grain boundaries, and a state in which incident light is likely to be scattered or reflected can be reached. Accordingly, in the case of a structure from which light is extracted on the side opposite to the substrate 12 with reference to the light emitting functional layer 14 (i.e., on the electrode 16 side), luminous efficiency can be increased by allowing scattered light and reflected light from the substrate 12 to be easily emitted. Moreover, a highly translucent oriented zinc oxide sintered body can be obtained by using a production method that reduces the grain boundary area or porosity, such as a method that reduces the sintered body thickness, increases the grain diameter during sintering, or eliminates pores. Hot isostatic pressing (HIP) and hot pressing (HP) are usable to obtain such an oriented zinc oxide sintered body. It is also possible to extract light from the substrate 12 side with reference to the light emitting functional layer 14 by using a highly translucent oriented zinc oxide sintered body for the substrate 12. In this way, even when the state of light emission in the light emitting functional layer is not uniform, the light intensity can be homogenized in the plane by causing light to travel through the translucent oriented zinc oxide sintered body. Due to these various factors, a large-area surface light-emitting device that has high luminous efficiency and is capable of homogenous light emission can be inexpensively provided according to the present invention in which an oriented polycrystalline zinc oxide sintered body in a plate shape is used as a substrate. Moreover, by forming a surface light-emitting device, a certain level of luminance can be obtained even when the applied electrical current is low.

On the other hand, in the case where an unoriented polycrystalline zinc oxide sintered body is used for the substrate, grains with various crystal orientations undergo crystal growth in random directions when the constituting layers of the light emitting functional layer 14 are formed. As a result, crystal phases mutually interfere and inhibit epitaxial growth, and it is thus not possible to create a state in which the crystal orientation is aligned in the normal direction of the substrate. Moreover, since the rate of crystal growth is different depending on the plane orientation, a homogenous, uneven light emitting functional layer cannot be formed, and it is thus difficult to form a light emitting functional layer of good quality.

As described above, the use of an oriented polycrystalline zinc oxide substrate enables manufacture of surface light-emitting devices that are less expensive and have a larger area than those manufactured when a single crystal substrate is used. Accordingly, it is preferable that the substrate 12 has an area of 25 cm² or greater, more preferably 100 cm² or greater, and even more preferably 400 cm² or greater. In other words, it is preferable that the substrate 12 has a size of 5×5 cm or greater, more preferably 10×10 cm or greater, and even more preferably 20×20 cm or greater. The larger the substrate 12 is, the more preferable it is, because the surface light-emitting device can be used in a wider variety of applications such as surface light-emitting lightings, so the upper limit of the area or the size should not be specified.

The average grain diameter of zinc oxide single crystal grains constituting the oriented polycrystalline zinc oxide sintered body is preferably 1 to 100 μm, more preferably 10 to 80 μm, and even more preferably 20 to 50 μm. An average grain diameter within these ranges results in excellent luminous efficiency, mechanical strength, light scattering characteristics, reflectivity, and like properties. The average grain diameter of grains in the sintered body of the present invention is measured by the following method. That is, a sample having an appropriate size is cut out from a plate-like sintered body, a surface perpendicular to the plate surface is polished and subjected to etching in 0.3 M nitric acid for 10 seconds, and then an image is taken with a scanning electron microscope. The visual field range is determined in such a way that when straight lines parallel and perpendicular to the plate surface are drawn, each straight line crosses 10 to 30 grains. The average grain diameter is determined by: drawing three straight lines parallel to the plate surface; taking the average of the line segment lengths inside all grains crossed by the straight lines; multiplying the average by 1.5 to give a value regarded as $a_1$; similarly, drawing three straight lines perpendicular to the plate surface; taking the average of the line segment lengths inside all grains crossed by the straight lines; multiplying the average by 1.5 to give a value regarded as $a_2$; and calculating $(a_1+a_2)/2$.

The direction of the oriented plane of the oriented polycrystalline zinc oxide sintered body is not particularly limited, and it may be the (002) plane, (100) plane, (110) plane, (101) plane, or another plane. As for the degree of orientation, it is preferable that the degree of orientation at the substrate surface is, for example, 50% or greater, more preferably 65% or greater, and even more preferably 75% or greater. The degree of orientation can be determined by measuring an XRD profile through irradiating the surface of plate-like zinc oxide with X rays using an XRD apparatus (such as trade name "RINT-TTR III" manufactured by Rigaku Corporation) and making a calculation according to the formulae below in the case of evaluating a sintered body oriented along a plane other than the (110) plane.

$$F_{(hkl)} = \frac{p - p_0}{1 - p_0} \times 100 \qquad \text{[Formula 1]}$$

-continued $$p_0 = \frac{I_0(hkl)}{I_0(100) + I_0(002) + I_0(101) + I_0(102)}$$

$$p = \frac{I_s(hkl)}{I_s(100) + I_s(002) + I_s(101) + I_s(102)}$$

where $F_{(hkl)}$ is the degree of orientation of the (hkl) plane; $I_0$(hkl) is the diffraction intensity (integral value) of the (hkl) plane in ICDD No. 361451; $I_0$(100), $I_0$(002), $I_0$(101), and $I_0$(102) are the diffraction intensities (integral values) of the (100) plane, (002) plane, (101) plane, and (102) plane in ICDD No. 361451, respectively; $I_s$(hkl) is the diffraction intensity (integral value) of the (hkl) plane in a sample; and $I_s$(100), $I_s$(002), $I_s$(101), and $I_s$(102) are the diffraction intensities (integral values) of the (100) plane, (002) plane, (101) plane, and (102) plane in the sample, respectively.

The above formulae are intended for the case where the (110) plane does not need to be taken into consideration. In the case where the (110) plane needs to be taken into consideration, i.e., in the case of evaluating a (110) plane-oriented sintered body, $I_0$(110) and $I_s$(110) corresponding to the diffraction intensity of the (110) plane may be applied to the denominators of the second and third formulae above, respectively. That is, $I_0$(110) is the diffraction intensity (integral value) of the (110) plane in ICDD No. 361451, and $I_s$(110) is the diffraction intensity (integral value) of the (110) plane in the sample.

The light emitting functional layer 14 is provided on the substrate. The light emitting functional layer 14 may be a layer responsible for the light emitting function of a light-emitting device, and the type and the system of the light-emitting device are not limited as long as a desired light emitting function can be secured on the oriented polycrystalline zinc oxide sintered body that is a component of the substrate 12. Accordingly, the light emitting functional layer 14 may emit visible light such as blue light or red light or may emit ultraviolet light with or without visible light. In this regard, the light emitting functional layer 14 shown in FIG. 1 is configured to emit ultraviolet light, and therefore a phosphor layer 17 is separately provided to convert ultraviolet light into visible light. It is preferable that the light emitting functional layer 14 constitutes at least part of a light-emitting device that utilizes a p-n junction, and this p-n junction may include a light emitting layer between a p-type layer and an n-type layer. At this time, a double heterojunction may be used in which a layer having a smaller band gap than the p-type layer and the n-type layer is used as the light emitting layer, or a single heterojunction may be used in which either the p-type layer or the n-type layer has a larger band gap than the light emitting layer. Moreover, as one form of the p-type layer/light emitting layer/n-type layer configuration, a quantum well structure can be adopted in which the thickness of the light emitting layer is made small. Needless to say, in order to obtain a quantum well, a double heterojunction should be employed in which the band gap of the light emitting layer is made smaller than those of the p-type layer and the n-type layer. Moreover, a multiple quantum well structure (MQW) may be used in which a large number of such quantum well structures are stacked. Adopting these structures makes it possible to increase luminous efficiency in comparison to a p-n junction. In the case of a p-n junction, each of the p-type layer, n-type layer, and light emitting layer (if a light emitting layer is included) can be composed of a zinc oxide-based material, it is thus easy to match direction or crystal orientation with that of the substrate also composed of zinc oxide, and thereby luminous efficiency can be further increased.

It is preferable that the light emitting functional layer 14 includes at least a p-type zinc oxide layer 14a composed of ZnO doped with a p-type dopant. Accordingly, a light-emitting device based on a p-n junction can be formed in combination with an n-type zinc oxide layer 14b. On the other hand, even when a configuration without the n-type zinc oxide layer 14b is employed, configuring the substrate 12 to be able to function as an n-type zinc oxide layer makes it possible to form a light-emitting device based on a p-n junction in combination with the substrate 12 in the case where a non-doped oriented zinc oxide sintered body or an oriented zinc oxide sintered body doped with an n-type dopant is used as the substrate 12. Since a non-doped oriented zinc oxide sintered body behaves like n-type zinc oxide when the substrate has oxygen defects, light emission can be achieved with a similar structure. Preferable examples of p-type dopants include one or more selected from the group consisting of nitrogen (N), phosphorus (P), arsenic (As), carbon (C), lithium (Li), sodium (Na), potassium (K), silver (Ag), and copper (Cu). Moreover, the p-type zinc oxide layer may be composed of ZnO formed into a mixed crystal with a crystal of one or more selected from the group consisting of MgO, CdO, ZnS, ZnSe, and ZnTe, and this mixed-crystal ZnO may be doped with a p-type dopant. For example, a compound in which $Mg_xZn_{1-x}O$ ($0.1 \leq x \leq 0.4$), which is a mixed crystal of ZnO and MgO, is doped with N is particularly preferable. Forming ZnO into a mixed crystal with MgO widens the band gap and makes it possible to shift the emission wavelength toward the high energy side. Moreover, ZnO may be formed into a mixed crystal with CdO, ZnS, ZnTe, or ZnSe, and this narrows the band gap and makes it possible to shift the emission wavelength toward the low energy side.

On the other hand, when an oriented zinc oxide sintered body doped with a p-type dopant is used for the substrate 12, it is preferable that the light emitting functional layer 14 includes at least an n-type zinc oxide layer composed of ZnO doped with an n-type dopant. Accordingly, a light-emitting device based on a p-n junction can be formed in combination with a p-type zinc oxide layer 14b. On the other hand, in the case of a configuration without a p-type zinc oxide layer, configuring the substrate 12 to be able to function as a p-type zinc oxide layer makes it possible to form a light-emitting device based on a p-n junction in combination with the substrate 12. Preferable examples of n-type dopants include one or more selected from the group consisting of aluminum (Al), gallium (Ga), indium (In), boron (B), fluorine (F), chlorine (Cl), bromine (Br), iodine (I), and silicon (Si). Moreover, the n-type zinc oxide layer may be composed of ZnO formed into a mixed crystal with a crystal of one or more selected from the group consisting of MgO. CdO, ZnS, ZnSe, and ZnTe, and this mixed-crystal ZnO may be doped with an n-type dopant. Forming a mixed crystal alters the band gap as with the p-type layer described above, thus making it possible to control the emission wavelength.

As described above, when non-doped zinc oxide or zinc oxide doped with an n-type dopant is used as the substrate 12, the light emitting functional layer 14 may further include an n-type zinc oxide layer 14b doped with an n-type dopant between the p-type zinc oxide layer 14a and the substrate 12. Preferable examples of n-type dopants include one or more selected from the group consisting of aluminum (Al), gallium (Ga), indium (In), boron (B), fluorine (F), chlorine (Cl), bromine (Br), iodine (I), and silicon (Si). Moreover, the n-type zinc oxide layer may be composed of ZnO formed into a mixed crystal with a crystal of one or more selected from the group consisting of MgO, CdO, ZnS, ZnSe, and ZnTe, and this mixed-crystal ZnO may be doped with an n-type dopant. For example, a compound in which $Mg_xZn_{1-x}O$ (0.1≤x≤0.4), which is a mixed crystal of ZnO and MgO, is doped with Al or Ga is particularly preferable. As described above, when the substrate 12 is configured to function as an n-type zinc oxide layer, the n-type zinc oxide layer 14b can be omitted.

On the other hand, when zinc oxide doped with a p-type dopant is used as the substrate 12, the light emitting functional layer 14 may be further provided with a p-type zinc oxide layer 14b doped with a p-type dopant between the n-type zinc oxide layer 14a and the substrate 12. Preferable examples of p-type dopants include one or more selected from the group consisting of nitrogen (N), phosphorus (P), arsenic (As), carbon (C), lithium (Li), sodium (Na), potassium (K), silver (Ag), and copper (Cu). Moreover, the p-type zinc oxide layer may be composed of ZnO formed into a mixed crystal with a crystal of one or more selected from the group consisting of MgO, CdO, ZnS, ZnSe, and ZnTe, and this mixed-crystal ZnO may be doped with a p-type dopant. As described above, when the substrate 12 is configured to function as a p-type zinc oxide layer, the p-type zinc oxide layer 14b can be omitted.

When non-doped zinc oxide or zinc oxide doped with an n-type dopant is used as the substrate 12, the light emitting functional layer 14 may have at least a light emitting layer that has a smaller band gap than both the p-type zinc oxide layer 14a and the n-type zinc oxide layer 14b, that is composed of ZnO or a mixed crystal of ZnO and one or more selected from the group consisting of MgO, CdO, ZnS, ZnSe, and ZnTe, and that contains neither a p-type dopant nor an n-type dopant, between the p-type zinc oxide layer 14a and the n-type zinc oxide layer 14b. A configuration in which this light emitting layer is made thin corresponds to the light-emitting device having a quantum well structure, which is one form of a p-n junction, and luminous efficiency can be further increased. When an n-type zinc oxide substrate is used without the n-type zinc oxide layer 14b, the light emitting functional layer 14 may be configured to have at least a light emitting layer that has a smaller band gap than both the p-type zinc oxide layer 14a and the oriented polycrystalline zinc oxide sintered body 12, that is composed of ZnO or a mixed crystal of ZnO and one or more selected from the group consisting of MgO, CdO, ZnS, ZnSe, and ZnTe, and that contains neither a p-type dopant nor an n-type dopant, between the p-type zinc oxide layer 14a and the oriented polycrystalline zinc oxide sintered body 12.

When zinc oxide doped with a p-type dopant is used for the substrate 12 as well, the light emitting functional layer 14 may have at least a light emitting layer that has a smaller band gap than both the n-type zinc oxide layer 14a and the p-type zinc oxide layer 14b, that is composed of ZnO or a mixed crystal of ZnO and one or more selected from the group consisting of MgO, CdO, ZnS, ZnSe, and ZnTe, and that contains neither a p-type dopant nor an n-type dopant, between the n-type zinc oxide layer 14a and the p-type zinc oxide layer 14b. A configuration in which this light emitting layer is made thin corresponds to the light-emitting device having a quantum well structure, which is one form of a p-n junction, and luminous efficiency can be further increased. When a p-type zinc oxide substrate is used without the p-type zinc oxide layer 14b, the light emitting functional layer 14 may be configured to have at least a light emitting layer that has a smaller band gap than both the n-type zinc oxide layer 14a and the oriented polycrystalline zinc oxide sintered body 12, that is composed of ZnO or a mixed crystal of ZnO and one or more selected from the group consisting of MgO, CdO, ZnS, ZnSe, and ZnTe, and that contains neither a p-type dopant nor an n-type dopant, between the n-type zinc oxide layer 14a and the oriented polycrystalline zinc oxide sintered body 12.

The light emitting functional layer 14 is preferably made of a material that epitaxially grows in conformity with the atomic arrangement at the surface of the oriented zinc oxide sintered body 12 and thereby has good crystallinity, but the material is not particularly limited. For example, the light emitting functional layer 14 may be composed of at least one selected from zinc oxide-based materials, gallium nitride-based materials, aluminum nitride-based materials, copper oxide-based materials, nickel oxide-based materials, zinc telluride-based materials, and zinc sulfide-based materials. These material systems may contain another element. For example, a zinc oxide-based material may be a material that contains at least a zinc oxide component, e.g., a solid solution such as $Mg_xZn_{1-x}O$. However, the use of a material different from zinc oxide for the light emitting functional layer 14 may result in heteroepitaxial growth, and in some cases, may cause a lattice mismatch between the surface atom arrangement of the oriented zinc oxide sintered body and the light emitting functional layer 14, deteriorating the crystallinity. Moreover, the use of a material that easily reacts with the oriented zinc oxide sintered body for the light emitting functional layer 14 possibly inhibits epitaxial growth and impairs luminous efficiency. Accordingly, a buffer layer 13 for suppressing a lattice mismatch and a reaction may be provided between the light emitting functional layer 14 and the oriented zinc oxide sintered body. Although the material of the buffer layer 13 is not particularly limited, a material preferably has a crystal structure identical or similar to that of the light emitting functional layer 14, and a material having an identical or close lattice constant may be used. For example, when a gallium nitride-based material is grown on the oriented zinc oxide sintered body, a gallium nitride layer having a thickness of approximately 300 to 1000 nm may be provided as the buffer layer 13. As for the buffer layer 13, after forming a thin film layer having a thickness of approximately 30 to 100 nm at a low temperature of 500 to 600° C., a thick buffer layer 13 may be formed at a high temperature of 600° C. or higher. This makes it possible to suppress the reaction between zinc oxide and gallium nitride and enables epitaxial growth. When the buffer layer 13 or the light emitting functional layer 14 is partially and/or entirely formed, the buffer layer 13 or the light emitting functional layer 14 may be formed after a seed crystal layer is formed on the oriented zinc oxide sintered body substrate. The respective film forming methods for the seed crystal layer, buffer layer 13, and light emitting functional layer are not particularly limited as long as the methods cause epitaxial growth. For example, when a buffer layer 13 and a light emitting functional layer that are composed of a gallium nitride-based material are formed using a liquid-phase epitaxial method such as liquid-phase deposition or flux, film formation by the liquid-phase epitaxial method may be performed after an extremely thin gallium nitride seed crystal is formed on an oriented zinc oxide sintered body substrate using a vapor-phase epitaxial such as MBE, RS-MBE, sputtering, or MOCVD. Needless to say, the same film forming method may be used for the entire process, and films of the seed crystal, buffer layer 13, and light emitting functional layer may be each formed using, for example, MBE.

As a form of a light emitting functional layer composed of a gallium nitride-based material on an oriented zinc oxide sintered body, a structure may be used in which, for example, a buffer layer 13 is provided on an n-type oriented zinc oxide sintered body, and, further, an n-type gallium nitride layer and a p-type gallium nitride layer are epitaxially grown in this order. For such a structure, the n-type oriented zinc oxide sintered body can be also used as an electrode. Moreover, a buffer layer 13 composed of a non-doped gallium nitride layer may be provided on a non-doped oriented zinc oxide sintered body, and, further, an n-type gallium nitride layer and a p-type gallium nitride layer may be grown. The order of stacking the p-type gallium nitride layer and the n-type gallium nitride layer may be inverse. Preferable examples of p-type dopants used for the p-type gallium nitride layer include one or more selected from the group consisting of beryllium (Be), magnesium (Mg), calcium (Ca), strontium (Sr), zinc (Zn), and cadmium (Cd). Preferable examples of n-type dopants used for the n-type gallium nitride layer include one or more selected from the group consisting of silicon (Si), germanium (Ge), and tin (Sn).

The p-type gallium nitride layer and/or the n-type gallium nitride layer may be composed of gallium nitride formed into a mixed crystal with a crystal of one or more selected from the group consisting of AlN and InN, and the p-type layer and/or the n-type layer may be this mixed-crystal gallium nitride that is doped with a p-type dopant or an n-type dopant. For example, doping $Al_xGa_{1-x}N$, which is a mixed crystal of gallium nitride and AlN, with Mg makes it possible to provide a p-type layer, and doping $Al_xGa_{1-x}N$ with Si makes it possible to provide an n-type layer. Forming gallium nitride into a mixed crystal with AlN widens the band gap and makes it possible to shift the emission wavelength toward the high energy side. Moreover, gallium nitride may be formed into a mixed crystal with InN, and this narrows the band gap and makes it possible to shift the emission wavelength toward the low energy side.

Between the p-type gallium nitride layer and the n-type gallium nitride layer, there may be at least a light emitting layer that is composed of GaN or a mixed crystal of GaN and one or more selected from the group consisting of AlN and InN, which has a smaller band gap than the both layers, and is free from a p-type dopant and an n-type dopant. The light emitting layer has a structure that forms a double heterojunction with a p-type layer and an n-type layer, and a configuration in which this light emitting layer is made thin corresponds to the light-emitting device having a quantum well structure, which is one form of a p-n junction, and luminous efficiency can be further increased. Moreover, the light emitting layer may be configured to have a smaller band gap than either layer, be composed of GaN or a mixed crystal of GaN and one or more selected from the group consisting of AlN and InN, and contain neither a p-type dopant nor an n-type dopant. Luminous efficiency can be further increased also by such a single heterojunction.

As described above, the material of the buffer layer 13 is not particularly limited as long as it suppresses the reaction between zinc oxide and gallium nitride and enables epitaxial growth. For example, the material may be non-doped GaN or n-type-doped or p-type-doped GaN. Moreover, the material may be AlN or InN having a close lattice constant or a mixed crystal formed with GaN and one or more crystals selected from the group consisting of AlN and InN.

It is particularly preferable that the light emitting functional layer 14 has a structure epitaxially grown in conformity with the orientation of the oriented polycrystalline zinc oxide sintered body and thereby has a crystal orientation aligned in the normal direction. Due to the orientation of the polycrystalline zinc oxide sintered body, which is a component of the substrate 12, the crystal orientation of the light emitting functional layer 14 is also developed in conformity with the orientation of the substrate 12 and therefore becomes uniform, and it is thus possible to obtain, even with a polycrystalline light emitting functional layer, excellent light emission characteristics close to those obtained with a single-crystalline light emitting functional layer. Film formation method for the light emitting functional layer 14 having such a structure is not particularly limited as long as it promotes growth in conformity with the orientation of the substrate, and preferable examples include vapor-phase epitaxial methods such as sputtering, molecular beam epitaxy (MBE), radical source molecular beam epitaxy (RS-MBE), metal organic chemical vapor deposition (MOCVD), and pulsed laser ablation (PLD); solid-phase epitaxial methods; liquid-phase epitaxial methods such as liquid-phase deposition, flux, a hydrothermal method, spin coating, and dipping; and the like. A solid-phase epitaxial method can be preferably performed by, for example, forming a film on a substrate by an aerosol deposition method (AD method) in advance and then heating the film to form a single crystal. As for a vapor-phase epitaxial method, for example, in the case where a light emitting functional layer composed of a gallium nitride-based material is produced using MOCVD, an organic metal gas containing at least gallium (Ga) (such as trimethylgallium) and a gas containing at least nitrogen (N) (such as ammonia) as raw materials may be flown over a substrate to allow growth in, for example, an atmosphere containing hydrogen, nitrogen, or both within a temperature range of approximately 300 to 1200° C. In this case, film formation may be performed by suitably introducing an organic metal gas containing indium (In) or aluminum (Al) for band gap control as well as silicon (Si) and magnesium (Mg) as an n-type and p-type dopant (such as trimethylindium, trimethylaluminum, monosilane, disilane, and bis-cyclopentadienylmagnesium). In this way, the functional layer is grown in conformity with the sintered grain diameter of the polycrystalline zinc oxide sintered body, and therefore a structure similar to an aggregate of columnar structures is obtained in which the normal is aligned in a single direction (single crystals) and grain boundaries exist in the x-y direction. In this case, since the light emitting functional layer has grain boundaries in the x-y direction, light in the horizontal direction is scattered and reflected by grain boundaries, and, as a result, light in the normal line direction becomes intensified. Consequently, the directivity of light is increased, and higher intensity and higher efficiency are obtained.

As described above, MOCVD is also usable in the case where the light emitting functional layer, buffer layer 13, and/or seed crystal composed of a material other than zinc oxide are formed. For example, in the case where a light emitting functional layer composed of a gallium nitride-based material is produced by using MOCVD, an organic metal gas containing at least gallium (Ga) (such as trimethylgallium) and a gas containing at least nitrogen (N) (such as ammonia) as raw materials may be flown over a substrate to allow growth in, for example, an atmosphere containing hydrogen, nitrogen, or both, within a temperature range of approximately 300 to 1200° C. However, such a high-temperature reducing atmosphere and the zinc oxide oriented sintered body that serves as a substrate may react and evaporate. Concerning this problem, the inventors have found that the reaction with the reducing gas is suppressed by doping the zinc oxide oriented sintered body with at least one element whose oxide has a boiling point of 2000° C. or higher, and the evaporation of the zinc oxide oriented sintered body can be suppressed. Although the reason why such elements are preferable is not clear, it is considered that such elements are thermodynamically stable and unlikely to react with hydrogen or a like reducing atmosphere and thus serve as passivating materials. Among such dopants, one or more selected from aluminum (Al) and magnesium (Mg) are more preferable. For example, the use of a zinc oxide oriented sintered body doped with aluminum (Al) as an n-type dopant to have zinc:aluminum (Al) =100:2(atomic ratio) enables epitaxial growth of a gallium nitride layer while suppressing the reaction between the zinc oxide oriented sintered body and the reducing atmosphere as well as the resulting evaporation in MOCVD. The limit of the doping amount of Al in zinc oxide is said to be zinc: aluminum of approximately 100:0.3. Adding Al such that the doping amount of Al is zinc:aluminum of 100:0.3 or greater may result in the formation of spinel ($ZnAl_2O_4$) as a heterogeneous phase. Even when an n-type dopant is added in an amount exceeding the solubility limit and a heterogeneous phase such as spinel is formed in this way, no particular problem arises as long as the amount allows zinc oxide to be the main phase. The main phase refers to a domain that accounts for more than 50% in terms of area ratio when a randomly selected cross-section is revealed by cutting. For example, a material that serves as the main phase can be determined from a mapping image obtained by an EPMA. The analytical method is not particularly limited as long as the main phase can be determined. The total amount of the above dopant is preferably zinc:dopant element =100:0.01 (atomic ratio) or greater, more preferably 100:0.3 (atomic ratio) or greater, and even more preferably 100:2 (atomic ratio) or greater.

Although epitaxial growth does not occur, the light emitting functional layer can be produced also by a technique according to which p-type and n-type grains (e.g., p-type and n-type zinc oxide grains) and/or precursors thereof are applied by a solution method such as spin coating or dipping, and heat-treated at 300 to 700° C.

The light emitting functional layer 14 may be an oriented polycrystalline zinc oxide sintered body. In this case, it is preferable that the light emitting functional layer 14 includes at least the p-type zinc oxide layer 14a composed of ZnO doped with a p-type dopant or the n-type zinc oxide layer 14a composed of ZnO doped with an n-type dopant. Accordingly, a light-emitting device based on a p-n junction can be formed in combination with the n-type zinc oxide layer 14b or the p-type zinc oxide layer 14b. Such a light-emitting device based on a p-n junction may be formed by stacking a green sheet that is to be a p-type oriented polycrystalline zinc oxide sintered body and a green sheet that is to be an n-type oriented polycrystalline zinc oxide sintered body followed by firing, or may be formed by separately firing these green sheets to give a p-type oriented polycrystalline zinc oxide sintered body and an n-type oriented polycrystalline zinc oxide sintered body and then joining these sintered bodies. On the other hand, even in the case where a configuration without the n-type or p-type zinc oxide layer 14b is employed, configuring the substrate 12 to be capable of functioning as an n-type or p-type zinc oxide layer makes it possible to form a light-emitting device based on a p-n junction in combination with the substrate 12. Since zinc oxide in a non-doped oriented zinc oxide sintered body behaves like n-type zinc oxide when the substrate has oxygen defects, light emission can be achieved with a similar structure. The stacking of the oriented zinc oxide sintered body 14 onto the substrate 12 in this case can be carried out by firing after stacking a green sheet or by joining sintered bodies.

Depending on the conditions such as substrate heating and plasma exposure in the film formation process, there is a possibility that dopant diffusion occurs inside the light emitting functional layer or the substrate, thus the p-type layer, n-type layer, and/or light emitting layer do not sufficiently function, deteriorating luminous efficiency. Moreover, a large number of oxygen defects, nitrogen defects, and the like may occur in the film formation process. In order to activate the p-type and/or the n-type dopant, heat treatment may be suitably performed during or after the production of the light emitting functional layer, and a high temperature may be required especially for activating the p-type dopant. In such a process as well, dopant diffusion, oxygen defects, nitrogen defects, and the like as stated above may occur. It is known that such oxygen defects and nitrogen defects function as n-type carriers and thus adversely affect the function of the produced p-type layer. Examples of methods for eliminating oxygen defects and nitrogen defects include heat treatment in an oxygen-containing atmosphere or a nitrogen-containing atmosphere as well as oxidizing or nitriding treatment by oxygen plasma or nitrogen plasma exposure, but there is a possibility of dopant diffusion also in these treatments, deteriorating luminous efficiency. Accordingly, it is desirable to select a combination of a light emitting functional layer component and a dopant, which does not cause diffusion. Especially when a zinc oxide-based material is used for the light emitting functional layer, and n-type dopant Al, Ga and/or In is used in the zinc oxide-based material, the n-type dopant is likely to diffuse due the aforementioned heat treatment or the like in some cases.

For these reasons, especially the activation of a p-type dopant which requires high-temperature treatment may be performed in a state without contact with the layer doped with an n-type dopant such as Al, Ga, or In. An example of this may be a structure in which a non-doped oriented zinc oxide sintered body is used for the substrate 12, no n-type layer is formed, and the p-type layer 14a is formed. In this way, the light emitting functional layer 14 can be formed without n-type dopants such as Al, Ga, and In. Another example may be that an oriented zinc oxide sintered body doped with a p-type dopant is used for the substrate 12, and the n-type layer 14a is formed after performing activation treatment and oxygen defect and nitrogen defect eliminating treatment. Alternatively, an oriented zinc oxide sintered body doped with a p-type dopant or a non-doped oriented zinc oxide sintered body may be used for the substrate 12, and the p-type layer 14b may be formed thereon, and in this case as well, the n-type layer 14a may be formed after performing activation treatment and oxygen defect and nitrogen defect eliminating treatment. Diffusion of n-type dopant can be suppressed by these methods.

As another procedure for suppressing dopant diffusion, a passivation layer may be provided partially or entirely between the substrate 12 and the light emitting functional layer and/or between the p-type layer, n-type layer, and/or light emitting layer constituting the light emitting functional layer. In this way, dopant diffusion associated with heat treatment or the like can be suppressed. It is preferable that such a passivation layer is composed of a material that does not inhibit epitaxial growth or inhibit a p-n junction or a p-light emitting layer-n junction in the light emitting functional layer, and it is further preferable that such a passivation layer has a small thickness. The material of the passivation layer is not particularly limited. When a zinc oxide-based material is used for the light emitting functional layer in particular, a material that forms a solid solution therewith, a zinc oxide-containing material, or a nitride-based material having a close crystal structure is desirable. The material may be at least one selected from ZnO (non-doped), ZnON, $Mg_xZn_{1-x}O$, $Cd_xZn_{1-x}O$, ZnS, ZnTe, $Li_2O$, MgO, CaO, SrO, CoO, NiO, CuO, $ZnAl_2O_4$, GaN, AlN, $Al_xGa_{1-x}N$, $In_xGa_{1-x}N$, and $In_xAl_yGa_zN$.

Figure 2:
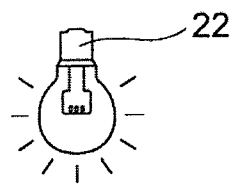
FIG. 2 is a diagram for explaining one example of a heating method for suppressing dopant diffusion.

Yet another procedure for suppressing dopant diffusion may be that an oriented zinc oxide sintered body doped with an n-type dopant is used as the substrate 12, the light emitting functional layer 14 composed of a light emitting layer 14c and the p-type layer 14a is formed thereon, and then heating is performed in one direction from the p-type layer 14a side such that a temperature gradient is created from the p-type layer 14a toward the substrate 12. FIG. 2 shows the configuration of a heating technique according to one form of such a procedure. In the configuration shown in FIG. 2, Pt foil 20 is provided on the p-type layer 14a, a near-infrared lamp 22 is provided above the Pt foil 20, and, on the other hand, the substrate 12 is supported on a quartz pedestal 24. In this configuration, near-infrared light emitted from the near-infrared lamp 22 is absorbed by the Pt foil 20, and heating is performed in one direction toward the substrate 12 from the p-type layer 14a due to heat conduction from the heated Pt foil 20. As a result, a temperature gradient is created from the p-type layer 14a to the substrate 12, enabling activation treatment and oxygen defect eliminating treatment to be performed on the p-type layer 14a while suppressing diffusion of the n-type dopant contained in the substrate 12. Such a procedure is also applicable to, for example, a structure in which an n-type layer is formed between the substrate 12 and the light emitting layer 14c. The heating method is not particularly limited. For example, optical heating in which a laser (such as a $CO_2$ laser, YAG laser, excimer laser, or semiconductor laser) or the like is used as a heat source, a high-frequency heating apparatus, etc., may be used. Moreover, a high dielectric may be provided in place of Pt foil, and heating may be performed in one direction using a dielectric heating apparatus or the like; or heating may be performed in one direction using a heat source such as a stage heater without providing Pt foil or a high dielectric.

When the light emitting functional layer 14 can emit ultraviolet light, it is preferable to further provide a phosphor layer 17 for converting ultraviolet light into visible light on the outer side of the electrode 16. The phosphor layer 17 is not particularly limited as long as it contains a known fluorescent component capable of converting ultraviolet rays into visible light. For example, preferable is such a configuration that a fluorescent component that becomes excited by ultraviolet light and emits blue light, a fluorescent component that becomes excited by ultraviolet light and emits blue to green light, and a fluorescent component that becomes excited by ultraviolet light and emits red light are allowed to be concomitantly present to obtain white light as a mixed color. Preferable combinations of such fluorescent components include $(Ca,Sr)_5(PO_4)_3Cl:Eu$, $BaMgAl_{10}O_{17}:Eu$, and Mn, $Y_2O_3S:Eu$, and it is preferable to disperse these components in a resin such as silicone resin to form the phosphor layer 17. Such fluorescent components are not limited to components exemplified above, and other ultraviolet-excited phosphors such as yttrium aluminum garnet (YAG), silicate-based phosphors, and oxynitride-based phosphors may be combined.

Moreover, when the light emitting functional layer 14 can emit blue light, it is preferable that the phosphor layer 17 for converting blue light into yellow light is further provided on the outer side of the electrode 16. The phosphor layer 17 is not particularly limited as long as it contains a known fluorescent component capable of converting blue light into yellow light. For example, it may be a combination with a phosphor that emits yellow light, such as YAG. Accordingly, a pseudo-white-light source can be obtained because blue light that has passed through the phosphor layer and yellow light from the phosphor are complementary. The phosphor layer 17 may be configured to perform both conversion of ultraviolet light into visible light and conversion of blue light into yellow light by including both a fluorescent component that converts blue into yellow and a fluorescent component that converts ultraviolet light into visible light.

The electrode 16 is provided on the light emitting functional layer 14. The electrode 16 may be composed of a known electrode material, and configuring the electrode 16 to be a transparent electroconductive film such as ITO or a metal electrode with a lattice structure, a moth eye structure, or the like having a high aperture ratio is preferable for being able to increase the efficiency of extracting light produced in the light emitting functional layer 14.

The electrode 16 may be configured to also function to reflect light emitted from the light emitting functional layer 14. In this case, it is desirable that the electrode 16 is composed of a material highly reflective to emitted light and is formed into a planar film. For example, when the light emitted from the light emitting functional layer is ultraviolet light, the material of the electrode 16 may contain Al as its main component, which has high reflectivity to ultraviolet light and has good electrical conductivity.

In FIG. 1, the substrate 12 is configured to function as a counter electrode, but otherwise a counter electrode may be provided on the opposite side of the substrate 12 from the light emitting functional layer 14. When the substrate 12 does not have sufficient electrical conductivity, the n-type layer included in the light emitting functional layer 14 may be configured to be an electrode, or an electrode may be provided on the n-type layer.

Figure 3:
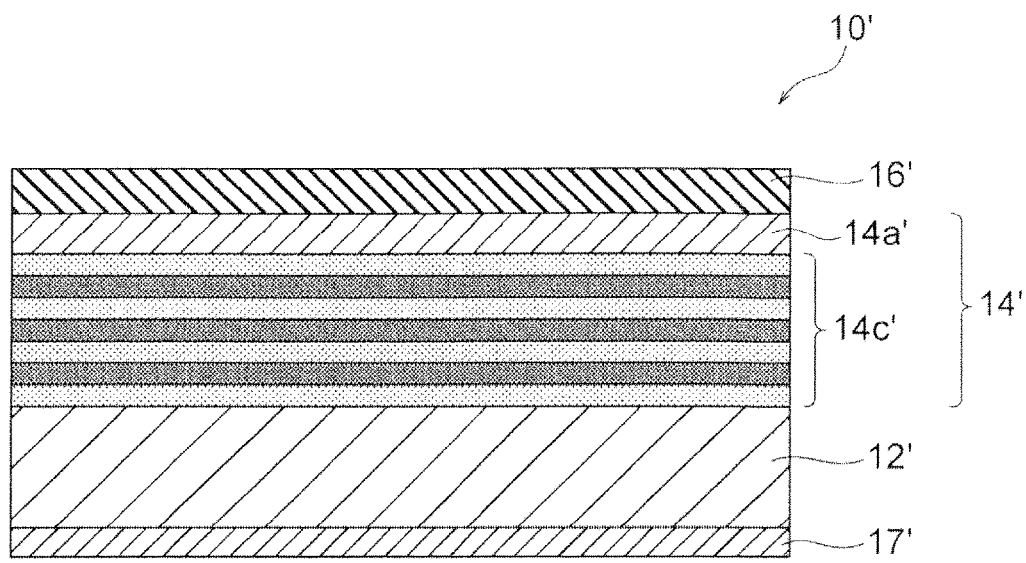
FIG. 3 is a cross-sectional schematic diagram showing another example of the surface light-emitting device of the present invention.

FIG. 3 shows one example of a surface light-emitting device in which a translucent oriented polycrystalline zinc oxide sintered body is used as the substrate 12. In a surface light-emitting device 10' shown in FIG. 3, a light emitting layer 14c' having a multiple quantum well (MQW) structure, a p-type layer 14a', and an electrode 16' that also serves as a reflective layer are provided in this order on a substrate 12' composed of a translucent oriented polycrystalline zinc oxide sintered body, and a phosphor layer 17' is provided on the opposite side of the substrate 12'. As described above, as for the oriented polycrystalline zinc oxide sintered body, a highly translucent oriented polycrystalline zinc oxide sintered body can be obtained by using a production method that reduces the grain boundary or pore area, such as a method that reduces the sintered body thickness, increases the grain diameter during sintering, or eliminates pores, e.g., hot isostatic pressing (HIP) and hot pressing (HP). By forming a structure as shown in FIG. 3, ultraviolet light emitted from the light emitting functional layer 14' composed of the p-type layer 14a' and the light emitting layer 14c' travels through the substrate 12' and becomes white light at the phosphor layer 17'. That is, according to this structure, a surface light-emitting device capable of emitting white light is formed. In addition, this structure, in which ultraviolet light emitted to the light emitting functional layer 14' side is also reflected at the reflective-layer-cum-electrode 16' to the substrate 12' side, enables a highly efficient surface light-emitting device to be formed. The electrode 16' does not need to double as a reflective layer, and needless to say, in this case, a reflective layer may be separately provided on the outer side of the electrode 16'. Alternatively, as a modification of the configuration shown in FIG. 3 or of a configuration similar thereto, a structure can also be formed in which large openings (light extraction openings) are ensured in the p-type electrode 16', and a phosphor layer is provided on the p-type electrode 16', while a reflective layer is provided on the opposite side of the substrate 12' from the light emitting functional layer 14'. In this way, light can be extracted from the light emitting functional layer 14' side relative to the substrate 12'.

Method for Producing Oriented Polycrystalline Zinc Oxide Sintered Body

As will be described below, the oriented polycrystalline zinc oxide sintered body used as the substrate 12 can be produced by shaping and sintering using a plate-like zinc oxide powder for a raw material.

(1) Preparation of Plate-like Zinc Oxide Powder

Plate-like zinc oxide powder that serves as a raw material may be produced by any method as long as an oriented sintered body is obtained by shaping and firing steps, which will be described below. For example, in order to obtain a (101) plane-oriented sintered body, a plate-like zinc oxide powder produced by the method disclosed in Patent Document 1 may be used as a raw material.

According to a preferable embodiment of the present invention, a plate-like zinc oxide powder produced by the following production method may be used as a raw material in order to obtain a (002) plane-oriented sintered body. This plate-like zinc oxide powder can be prepared by a method including the steps of subjecting a zinc ion-containing raw material solution to a solution method to produce plate-like zinc oxide precursor particles, and calcining the plate-like precursor particles by increasing the temperature to a calcination temperature at a rate of temperature increase of 150° C./h or lower to produce a zinc oxide powder composed of a plurality of plate-like zinc oxide particles.

In the plate-like zinc oxide powder production method for obtaining a (002) plane-oriented sintered body, first, plate-like zinc oxide precursor particles are produced by a solution method using a zinc ion-containing raw material solution. Examples of zinc ion sources include zinc sulfate, zinc nitrate, zinc chloride, organic acid salts such as zinc acetate, zinc alkoxides, and the like. Zinc sulfate is preferable because it can also supply sulfate ions, which will be described below. A production technique for plate-like zinc oxide precursor particles by a solution method is not particularly limited, and production can be performed according to a known technique.

It is preferable that the raw material solution comprises a water-soluble organic material and sulfate ions because a porous material having a large specific surface area can be obtained. Examples of the water-soluble organic material include alcohols, polyols, ketones, polyethers, esters, carboxylic acids, polycarboxylic acids, celluloses, saccharides, sulfonic acids, amino acids, and amines, and more specifically, aliphatic alcohols such as methanol, ethanol, propanol, butanol, pentanol, and hexanol; aliphatic polyhydric alcohols such as ethylene glycol, propanediol, butanediol, glycerine, polyethylene glycol, and polypropylene glycol; aromatic alcohols such as phenol, catechol, and cresol; alcohols having a heterocycle such as furfuryl alcohol; ketones such as acetone, methyl ethyl ketone, and acetylacetone; ethers or polyethers such as ethyl ether, tetrahydrofuran, dioxane, polyoxyalkylene ether, ethylene oxide adduct, and propylene oxide adduct; esters such as ethyl acetate, ethyl acetoacetate, and glycine ethyl ester; carboxylic acids polycarboxylic acids, or hydroxycarboxylic acids, such as formic acid, acetic acid, propionic acid, butanoic acid, butyric acid, oxalic acid, malonic acid, citric acid, tartaric acid, gluconic acid, salicylic acid, benzoic acid, acrylic acid, maleic acid, glyceric acid, eleostearic acid, polyacrylic acid, polymaleic acid, and acrylic acid-maleic acid copolymer, and salts thereof; carboxymethylcelluloses; monosaccharides such as glucose and galactose; polysaccharides such as sucrose, lactose, amylose, chitin, and cellulose; sulfonic acids such as alkylbenzenesulfonic acid, para-toluenesulfonic acid, alkylsulfonic acid, α-olelinsulfonic acid, polyoxyethylenealkylsulfonic acid, ligninsulfonic acid, and naphthalenesulfonic acid, and salts thereof; amino acids such as glycine, glutamic acid, aspartic acid, and alanine; hydroxyamines such as monoethanolamine, diethanolamine, triethanolamine, and butanolamine; trimethyl aminoethyl alkylamide; alkylpyridinium sulfuric acid salts; alkyltrimethylammonium halides; alkylbetaines; alkyl diethylene triamino acetic acids; and the like. Among these water-soluble organic materials, those that have at least one functional group from a hydroxyl group, a carboxyl group, and an amino group are preferable, and hydroxycarboxylic acids having a hydroxyl group and a carboxyl group and salts thereof are particularly preferable, with examples being sodium gluconate, tartaric acid, and the like. It is preferable that the water-soluble organic material is concomitantly present in a range of about 0.001 wt % to about 10 wt % in an aqueous ammonia-added raw material solution, which will be described below. A preferable sulfate ion source is zinc sulfate as stated above. The raw material solution may further comprise the above-described additive substance such as a dopant.

At this time, the raw material solution is preferably heated to a preliminary reaction temperature of 70 to 100° C., and more preferably 80 to 100° C. After or during this heating, aqueous ammonia is preferably added to the raw material solution, and the raw material solution to which aqueous ammonia has been added is preferably kept at a temperature of 70 to 100° C. for 0.5 to 10 hours and more preferably at a temperature of 80 to 100° C. for 2 to 8 hours.

Next, the plate-like precursor particles are calcined by increasing the temperature to a calcination temperature at a rate of temperature increase of 150° C./h or lower to produce a zinc oxide powder composed of a plurality of plate-like zinc oxide particles. It is considered that by reducing the rate of temperature increase to 150° C./h or lower, the crystal plane of the precursor material is easily inherited by zinc oxide when the precursor material changes to zinc oxide, thus resulting in an enhanced degree of orientation of plate-like particles in a green body. Also, it is considered that the connectivity of primary particles to each other is increased, and plate-like particles are thus unlikely to collapse. A preferable rate of temperature increase is 120° C./h or lower, more preferably 100° C./h or lower, even more preferably 50° C./h or lower, particularly preferably 30° C./h or lower, and most preferably 15° C./h or lower. The zinc oxide precursor particles are preferably washed, filtered, and dried before calcination. The calcination temperature is not particularly limited as long as the precursor compound such as zinc hydroxide can change into zinc oxide, and the calcination temperature is preferably 800 to 1100° C. and more preferably 850 to 1000° C. The plate-like precursor particles are kept at such a calcination temperature preferably for 0 to 3 hours and more preferably for 0 to 1 hour. Such temperature retaining conditions enable the precursor compound such as zinc hydroxide to change more reliably to zinc oxide. Due to such a calcination step, the plate-like precursor particles change into plate-like zinc oxide particles that have many pores.

Optionally, the zinc oxide powder may be mixed with an additive substance. Such additive substances may be, as secondary components, various additive agents or dopants as described above, which impart properties (such as electroconductive or insulative properties) desired depending on the use or the specification of a green body. These dopant elements may be added in the form of compounds containing these elements or in the form of ions to the zinc oxide powder. A method for adding the additive substance is not particularly limited, and in order to allow the additive substance to reach the interior of the line pores of the zinc oxide powder, preferable examples of such methods include (1) a method in which the additive substance is added in the form of a fine powder such as nanoparticles to the zinc oxide powder; (2) a method in which the additive substance is dissolved in a solvent and then added to the zinc oxide powder, and this solution is dried; and similar methods.

According to another preferable embodiment of the present invention, a plate-like zinc oxide powder produced by the following production method may be used as a raw material in order to obtain a (100) plane-oriented sintered body. This plate-like zinc oxide powder can be obtained by adding an aqueous alkaline solution to an aqueous zinc salt solution, stirring the mixture at 60 to 95° C. for 2 to 10 hours to form a precipitate, washing and drying this precipitate, and, further, grinding the resulting precipitate. The aqueous zinc salt solution may be a zinc ion-containing aqueous solution and is preferably an aqueous solution of a zinc salt such as zinc nitrate, zinc chloride, or zinc acetate. The aqueous alkaline solution is preferably an aqueous solution of sodium hydroxide, potassium hydroxide, or the like. Although the concentrations and the mixing ratio of the aqueous zinc salt solution and the aqueous alkaline solution are not particularly limited. It is preferable that an aqueous zinc salt solution and an aqueous alkaline solution having the same molar concentration are mixed in the same volume ratio. It is preferable to wash the precipitate with ion exchanged water multiple times. The washed precipitate is preferably dried at 100 to 300° C. Since the dried precipitate is spherical secondary particles in which plate-like zinc oxide primary particles are aggregated, it is preferable to subject the dried precipitate to a grinding step. It is preferable to perform this grinding with a ball mill for 1 to 10 hours after adding a solvent such as ethanol to the washed precipitate. This grinding yields a plate-like zinc oxide powder as primary particles. The plate-like zinc oxide powder obtained in this way preferably has a volume-based D50 average particle diameter of 0.1 to 1.0 μm, and more preferably 0.3 to 0.8 μm. This volume-based D50 average particle diameter can be measured with a laser diffraction particle size distribution analyzer.

(2) Molding and Firing Steps

The plate-like zinc oxide powder produced by the above method is oriented by a technique in which shearing force is used, to give an oriented green body. At this time, another element or component such as a dopant metal oxide powder (such as α-$Al_2O_3$ powder) may be added to the plate-like zinc oxide powder. Preferable examples of techniques in which shearing force is used include tape casting, extrusion molding, a doctor blade method, and any combination of these. Regarding the orientation techniques in which shearing force is used, in any of the techniques exemplified above as well, it is preferable that additives such as a hinder, a plasticizer, a dispersant, and a dispersion medium are suitably added to the plate-like zinc oxide powder to form a slurry, and this slurry is passed through a slit-like narrow discharge port to discharge and shape the slurry into a sheet form on a substrate. The slit width of the discharge port is preferably 10 to 400 μm. The amount of the dispersion medium is adjusted so that the viscosity of the slurry is preferably 5000 to 100000 cP and more preferably 20000 to 60000 cP. The thickness of the oriented green body shaped into a sheet form is preferably 5 to 500 μm and more preferably 10 to 200 μm. It is preferable that multiple pieces of this oriented green body that has been shaped into a sheet form are stacked to form a precursor laminate having a desired thickness, and this precursor laminate is subjected to press molding. This press molding can be preferably performed by packaging the precursor laminate in a vacuum pack or the like and subjecting it to isostatic pressing in hot water at a temperature of 50 to 95° C. under a pressure of 10 to 2000 kgf/cm². Moreover, when extrusion molding is used, the flow channel within a metal mold may be designed so that after passing through a narrow discharge port within the metal mold, sheets of the green body are integrated into a single body within the metal mold, and the green body is ejected in a laminated state. It is preferable to degrease the resulting green body in accordance with known conditions.

The oriented green body obtained as described above is fired at a firing temperature of 1000 to 1500° C., and preferably 1100 to 1400° C. to form a zinc oxide sintered body comprising oriented zinc oxide crystal grains. The firing time at the aforementioned firing temperature is not particularly limited, and is preferably 1 to 10 hours and more preferably 2 to 5 hours. The zinc oxide sintered body obtained in this way is an oriented sintered body that is, for example, (101), (100), or (002) plane-oriented in accordance with the type of the aforementioned raw-material plate-like zinc oxide powder. The degree of orientation of the sintered body is high, and preferably the degree of orientation at the substrate surface is 50% or greater, more preferably 65% or greater, and even more preferably 75% or greater. Moreover, a (110) plane-oriented sintered body may be produced according to the method disclosed in Patent Document 2.

EXAMPLES

The present invention will now be more specifically described by way of the following examples.

Example 1

A surface light-emitting device provided with a light emitting functional layer based on a p-n junction was prepared using a non-doped ZnO oriented sintered body substrate as follows.

(1) Preparation and Evaluation of Non-doped ZnO Oriented Sintered Body Substrate (1a) Preparation of Plate-like Zinc Oxide Powder A non-doped (002) plane-oriented ZnO powder was prepared as follows. 173 parts by weight of zinc sulfate heptahydrate (manufactured by Kojundo Chemical Laboratory Co., Ltd.) and 0.45 parts by weight of sodium gluconate (manufactured by Wako Pure Chemical Industries, Ltd.) were dissolved in 300 parts by weight of ion exchanged water. The solution thus obtained was placed in a beaker and dissolved by heating to 90° C. while stirring with a magnetic stirrer. This solution was kept at 90° C., and 49 parts by weight of 25% aqueous ammonia was added dropwise with a microtube pump while stirring. After the end of dropwise addition, the solution was retained for 4 hours at 90° C. while stirring, and then the solution was added to a large amount of ion exchanged water and left to stand still. The precipitates deposited in the bottom of the vessel were separated by filtration, further, washed with ion exchanged water 3 times, and dried to give a zinc oxide precursor material in the form of a white powder. The resulting zinc oxide precursor material was placed on a zirconia plate and calcined in air in an electric furnace to give a plate-like porous zinc oxide powder. The temperature schedule during calcination was as follows: the temperature was increased at a rate of temperature increase of 100° C./h from room temperature to 900° C., then kept at 900° C. for 30 minutes, and cooled naturally.

(1b) Shaping and Firing Steps 100 parts by weight of the resulting plate-like zinc oxide particles were mixed with 15 parts by weight of a binder (polyvinyl butyral: Part No. BM-2, manufactured by Sekisui Chemical Co., Ltd.), 10 parts by weight of a plasticizer (DOP: di(2-ethylhexyl)phthalate, manufactured by Kurogane Kasei Co., Ltd.), 3 parts by weight of a dispersant (trade name: Rheodol SP-030, manufactured by Kao Corporation), and a dispersion medium (2-ethylhexanol). The amount of the dispersion medium was adjusted to provide a slurry viscosity of 10000 cP. The slurry thus prepared was applied to a PET film by a doctor blade method to form a sheet having a thickness after drying of 20 μm. The resulting tape was cut into 20×20 mm sheet, and 500 pieces of the cut tape were stacked, placed on an aluminum plate having a thickness of 10 mm, and then vacuum-packed. This vacuum pack was subjected to isostatic pressing in hot water at 85° C. under a pressure of 100 kgf/cm² to prepare a green body in a plate shape. The resulting green body was placed in a degreasing furnace and degreased under 600° C., and 20 hour conditions. The resulting degreased body was fired at atmospheric pressures under 1400° C., and 5 hour conditions in nitrogen to prepare a ZnO oriented sintered body substrate in a plate shape.

(1c) Evaluation of Sintered Body Substrate

The resulting ZnO sintered body substrate was evaluated as follows.

(Evaluation of Degree of Orientation)

The degree of (002) plane orientation $F_{(002)}$ of the resulting sintered body was measured by XRD. In this measurement, an XRD profile was obtained by irradiating the surface of plate-like zinc oxide with X rays using an XRD apparatus (trade name "RINT-TTR III" manufactured by Rigaku Corporation), and evaluations were made according to the formulae below.

$$F_{(002)} = \frac{p - p_0}{1 - p_0} \times 100 \quad \text{[Formula 2]}$$

$$p_0 = \frac{I_0(002)}{I_0(100) + I_0(002) + I_0(101) + I_0(102)}$$

$$p = \frac{I_s(002)}{I_s(100) + I_s(002) + I_s(101) + I_s(102)}$$

where $F_{(002)}$ is the degree of orientation of the (002) plane; $I_0(002)$, $I_0(100)$, $I_0(101)$, and $I_0(102)$ are the diffraction intensities (integral values) of the (002) plane, (100) plane, (101) plane, and (102) plane in ICDD No. 361451, respectively; and $I_s(002)$, $I_s(100)$, $I_s(101)$, and $I_s(102)$ are the diffraction intensities (integral values) of the (002) plane, (100) plane, (101) plane, and (102) plane in a sample, respectively.

(Evaluation of Average Grain Diameter of Sintered Grains)

The average grain diameter of sintered body grains was measured by the following method. A 5×5×3 mm sample was cut out from the resulting plate-like sintered body, a surface perpendicular to the plate surface was polished and subjected to etching in nitric acid having a concentration of 0.3 M for 10 seconds, and then an image was taken with a scanning electron microscope. The visual field range was determined in such a way that when straight lines parallel and perpendicular to the plate surface were drawn, each straight line crossed 10 to 30 grains. The average grain diameter was determined by: drawing three straight lines parallel to the plate surface; taking the average of the line segment lengths inside all grains crossed by the straight lines; multiplying the average by 1.5 to give a value regarded as $a_1$; similarly, drawing three straight lines perpendicular to the plate surface; taking the average of the line segment lengths inside all grains crossed by the straight lines; multiplying the average by 1.5 to give a value regarded as $a_2$; and calculating $(a_1+a_2)/2$.

(Evaluation of Volume Resistivity)

The volume resistivity of the sintered body was measured by using a resistivity meter (manufactured by Mitsubishi Chemical Corporation, Loresta AX Model MCP-T370) by performing a four-point probe method near the central part of the plate surface of the plate-like sintered body.

As a result, the degree of (002) orientation of the sintered body substrate was 80%, the average grain diameter of sintered grains was 38 μm, and the volume resistivity was $1 \times 10^{-1}$ Ω·cm.

(2) Preparation and Evaluation of Surface Light-Emitting Device

A light emitting functional layer 14, an electrode 16, and a phosphor layer 17 were formed on the ZnO oriented sintered body substrate obtained above to prepare a surface light-emitting device 10 as shown in FIG. 1. The methods for forming the respective layers were as follows.

(2a) Film Formation of N-type ZnO Layer by Sputtering

A 100 nm film of an n-type ZnO layer 14b was formed on the ZnO oriented sintered body substrate 12 with a RF magnetron sputtering apparatus. For film formation, a ZnO target doped with 2 parts by weight of Al was used, and film formation conditions included a pure Ar atmosphere, a pressure of 0.5 Pa, an applied power of 150 W, and a film formation time of 5 minutes.

(2b) Film Formation of P-type ZnO Layer by MBE

A p-type ZnO layer 14a composed of N-doped ZnO was stacked on the n-type ZnO layer 14b by using a RS-MBE (radical source molecular beam epitaxy) apparatus. Zinc (Zn), which is a metal material, was irradiated in a Knudsen cell and supplied onto the substrate. Oxygen (O) and nitrogen (N), which are gaseous materials, were supplied as an oxygen radical (indicated as O*) and a nitrogen radical (indicated as N*), respectively, with a RF radical generator in which $O_2$ gas and NO gas were used as raw materials. The purities of the raw materials were 7N for Zn, 6N for $O_2$, and 5N for NO gas. The substrate was heated to 700° C. by using a resistance heater, and a film of the N-doped ZnO layer having a thickness of 100 nm was formed, with the flux of the gas sources being controlled such that the nitrogen concentration in the film was $1 \times 10^{20}$ cm$^{-3}$.

(2c) Film Formation of Electrode

A 30 nm Au film was formed as the electrode 16 by an electron beam evaporation method on the p-type ZnO layer 14a. Although a Au thin film was used as an electrode in this example, an electrode having a high aperture ratio such as a lattice-like electrode or a transparent electroconductive film of ITO or the like may be used in place of the Au thin film in order to increase emission intensity.

(2d) Film Formation of Phosphor

In order to form the phosphor layer 17, the electrode 16 was coated with about 5 μm of silicone resin in which $(Ca,Sr)_5(PO_4)_3Cl:Eu$, $BaMgAl_{10}O_{17}:Eu,Mn$, and $Y_2O_3S:Eu$ were dispersed as phosphor components. These phosphors become excited by ultraviolet light and emit blue light, blue-green light, and red light, respectively, and white light can be obtained as a mixed color.

(2e) Evaluation of Light-Emitting Device

When current was applied between the n-type ZnO layer and the electrode to perform I-V measurement, rectifying characteristics were confirmed, and it was thus verified that the ZnO:N film functioned as a p-type ZnO layer and that a p-n junction of good quality was formed. Moreover, due to the application of electricity, white light emission from the phosphor was confirmed, and when the emission wavelength was measured after removing the phosphor layer, emission of ultraviolet having about 375 nm was observed. From these results, it was verified that ultraviolet light from the p-n junction part was converted into visible light at the phosphor layer.

Example 2

Using an Al-doped n-type ZnO oriented sintered body substrate, a surface light-emitting device provided with a light emitting functional layer having a p-n junction was prepared as follows. In this example, the substrate itself served as an n-type semiconductor due to the Al doping and had sufficiently low resistance, and therefore, unlike Example 1, formation of an n-type layer film was omitted.

(1) Preparation and Evaluation of Al-doped ZnO Oriented Sintered Body Substrate (1a) Preparation of Raw Material Powder An Al-doped (002) plane-oriented ZnO powder was prepared as follows. 8.8 parts by weight of aluminum chloride hexahydrate (manufactured by Kojundo Chemical Laboratory Co., Ltd.) was added to and dissolved in 200 parts by weight of ethanol. Thereafter, the above solution was added to the plate-like zinc oxide particles prepared in Example 1 to bring the zinc:aluminum ratio to 100:0.2 (atomic ratio), then this mixture was dried by using a rotary evaporator, and thereby plate-like zinc oxide particles in which the aluminum component was uniformly dispersed was prepared.

(1 b) Shaping and Firing

A ZnO oriented sintered body substrate in a plate shape was prepared as in (1 b) of Example 1.

(1c) Evaluation of Sintered Body Substrate

The resulting ZnO sintered body substrate was evaluated as in (1c) of Example 1. As a result, the degree of (002) orientation of the sintered body substrate was 80%, the average grain diameter of sintered grains was 35 μm, and the volume resistivity was $8 \times 10^{-4}$ Ω·cm.

(2) Preparation and Evaluation of Surface Light-Emitting Device

A light emitting functional layer, an electrode, and a phosphor layer were formed on the ZnO oriented sintered body substrate obtained above to prepare a surface light-emitting device having the same configuration as shown in FIG. 1 except that there was no n-type ZnO layer. That is, in this example, the substrate itself served as an n-type semiconductor due to the Al doping and had sufficiently low resistance, and therefore, formation of an n-type ZnO layer film was omitted. The methods for forming the respective layers were as follows.

(2a) Film Formation of P-type ZnO Layer by Solid-phase Epitaxial Growth

Figure 4:
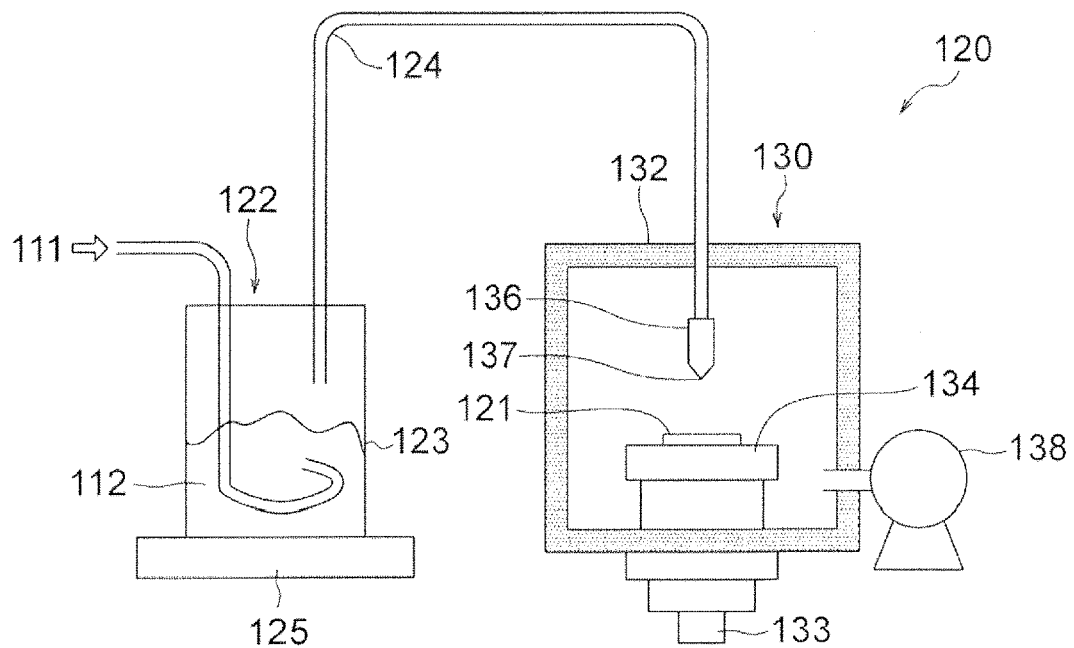
FIG. 4 is a cross-sectional schematic diagram showing the AD film formation apparatus used in Example 2.

Using a commercially available N-doped p-type ZnO powder (manufactured by Furukawa Denshi Co., Ltd.) as a film formation raw material, a p-type ZnO film was deposited on the ZnO oriented sintered body substrate by an aerosol deposition method (hereinafter AD). For AD film formation, a film formation apparatus 120 shown in FIG. 4 was used. This film formation apparatus 120 includes an aerosol generating part 122 for generating an aerosol of a raw material powder containing raw material components and a film forming part 130 for injecting the film forming powder onto a seed substrate 121 to form a film containing the raw material components.

The aerosol generating part 122 includes an aerosol generating chamber 123 for accommodating the raw material powder 112 and generating an aerosol upon receiving a supply of a carrier gas 11i from a gas cylinder (not shown), a raw material supply pipe 124 for supplying the generated aerosol to the film forming part 130, and a vibrator 125 for vibrating the aerosol generating chamber 123 and the aerosol present therein at a frequency of 10 to 100 Hz. The film forming part 130 includes a film forming chamber 132 where the aerosol is injected onto the seed substrate 121, a seed substrate holder 134 that is provided inside the film forming chamber 132 to fix the seed substrate 121, and an X-Y stage 133 for moving the seed substrate holder 134 in the X axis-Y axis direction. Also, the film forming part 130 includes an injection nozzle 136 having a slit 137 formed at the tip for injecting the aerosol onto the seed substrate 121, and a vacuum pump 138 for reducing the pressure of the film forming chamber 132.

In the film forming apparatus 120, nitrogen ($N_2$) gas was allowed to flow at a flow rate of 10 L/min as the carrier gas 111, the pressure of the aerosol generating chamber 123 was 50 kPa, the pressure inside the film forming chamber 132 was 0.1 kPa or less, and the opening size of the slit 137 provided in the film formation powder injection nozzle 136 was 10 mm×0.4 mm. As for the nozzle scanning method during film formation, 1 scan included a scanning distance of 200 mm at a scanning speed of 1 mm/sec, and after the end of 1 scan, a scanning position was moved 10 mm parallelly to perform film formation, and a scan of total 20 rows was performed as one cycle. This film formation was performed total 60 cycles to obtain an AD film having a thickness of about 2.5 μm and composed of N-doped ZnO.

Figure 5:
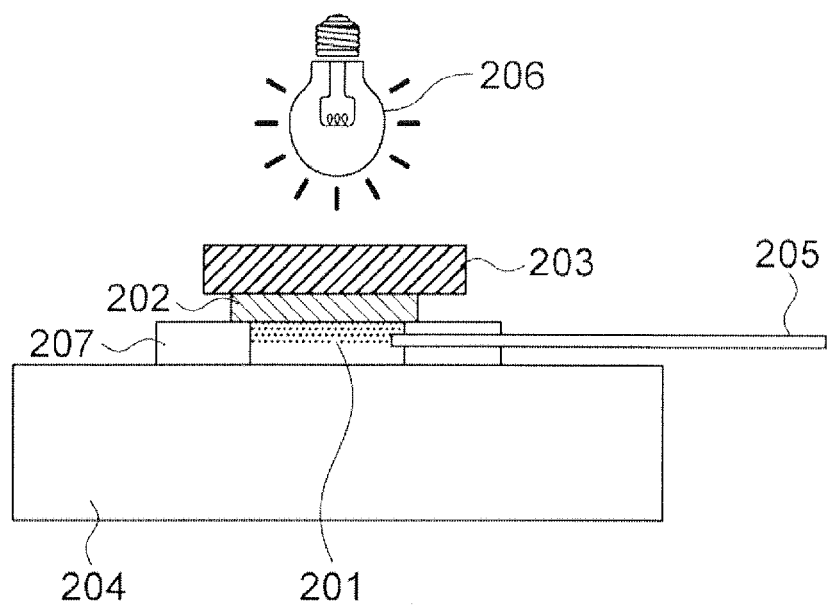
FIG. 5 is a cross-sectional schematic diagram showing the heater used in Example 2.

The resulting ZnO film was subjected to solid-phase epitaxial growth using a heater of FIG. 5. In FIG. 5, a near-infrared lamp 206 was used as a light source for optical heating. Since the near-infrared absorption coefficient of ZnO is low, a platinum plate 203 was provided on a ZnO oriented sintered body substrate 202, and near-infrared rays were irradiated from the ZnO oriented sintered body substrate 202 side to cause the platinum plate 203 to absorb the near-infrared rays, and thereby a film 201 was heated from the ZnO oriented sintered body substrate 202 side. The ZnO oriented sintered body substrate 202 and the platinum plate 203 were placed on a quartz pedestal 204 and a quartz sample holder 207, and the temperature of the film 201 was measured with a thermocouple 205. Heat treatment was performed in nitrogen, in which the film was heated at a rate of temperature increase of 400° C./min and kept at 1100° C. for 10 minutes. Due to this heat treatment, the ZnO film underwent solid-phase epitaxial growth in conformity with the surface atom arrangement of the ZnO oriented sintered body substrate and became a c-axis-oriented N-doped ZnO layer. Evaluation of orientation by XRD as described in Example 1 showed that the degree of orientation was 78%.

Although a solid-phase epitaxial method was used for forming the p-type layer film in this example, the production method is not particularly limited, and a technique may be used according to which the p-type ZnO powder is applied by MOCVD or a solution method such as spin coating or dipping and heat-treated at 200 to 700° C.

(2b) Film Formation of Electrode

Formation of an electrode film was performed as in (2c) of Example 1.

(2c) Film Formation of Phosphor

Formation of a phosphor layer film was performed as in (2d) of Example 1.

(2d) Evaluation of Light-emitting Device

When current was applied between the n-type ZnO film and the electrode to perform I-V measurement, rectifying characteristics were confirmed, and it was thus verified that the ZnO:N film functioned as a p-type ZnO layer and that a p-n junction of good quality was formed. Moreover, due to the application of electricity, white light emission from the phosphor was confirmed, and when the emission wavelength was measured alter removing the phosphor layer, emission of ultraviolet having about 375 nm was observed. From these results, it was verified that ultraviolet light from the p-n junction part was converted into visible light at the phosphor layer.

Example 3

Using a translucent oriented zinc oxide sintered body as a substrate, a surface light-emitting device having the above-described structure shown in FIG. 3 was prepared as follows.

(1) Preparation and Evaluation of Al-doped ZnO Oriented Sintered Body Substrate (1a) Preparation of Plate-like Zinc Oxide Powder An Al-doped (002) plane-oriented ZnO powder was prepared in the same manner as in (1a) of Example 2 except that the ratio was adjusted to be zinc:aluminum=100:0.1 (atomic ratio).

(1b) Shaping and Firing Steps 100 parts by weight of the resulting plate-like zinc oxide particles were mixed with 15 parts by weight of a binder (polyvinyl butyral: Part No. BM-2, manufactured by Sekisui Chemical Co., Ltd.), 10 parts by weight of a plasticizer (DOP: di(2-ethylhexyl)phthalate, manufactured by Kurogane Kasei Co., Ltd.), 3 parts by weight of a dispersant (trade name: Rheodol SP-030, manufactured by Kao Corporation), and a dispersion medium (2-ethylhexanol). The amount of the dispersion medium was adjusted to bring the slurry viscosity to 10000 cP. The slurry thus prepared was applied to a PET film by a doctor blade method to form a sheet having a thickness after drying of 20 μm. The resulting tape was cut into circles having a diameter of 50 mm, and then 50 pieces of the cut tape were stacked to prepare a green body in a plate shape. The resulting green body was placed in a degreasing furnace and degreased under 600° C., and 20 hour conditions. The resulting degreased body was subjected to hot-press firing under 1300° C. for 5 hour, 200 kgf/cm² press pressure conditions in air using an alumina mold to prepare a ZnO oriented sintered body substrate having a diameter of 50 mm and a thickness of about 500 μm.

(1c) Evaluation of Sintered Body Substrate

The resulting ZnO sintered body substrate was evaluated as in (1c) of Example 1. As a result, the degree of (002) orientation of the sintered body substrate was 85%, the average grain diameter of sintered grains was 45 μm, and the volume resistivity was $2 \times 10^{-3}$ Ω·cm.

(2) Preparation and Evaluation of Surface Light-Emitting Device

A surface light-emitting device 10' was prepared by forming a light emitting functional layer 14' composed of a p-type layer 14a' and a light emitting layer 14c' having a multiple quantum well structure (MQW), a reflective-layer-cum-electrode 16', and a phosphor layer 17' on the ZnO oriented sintered body substrate 12' obtained above so as to have the layer configuration shown in FIG. 3. The methods for forming the respective layers were as follows.

(2a) Film Formation of Light Emitting Functional Layer

A film of the light emitting functional layer 14' was formed on the substrate 12' using a RS-MBE (radical source molecular beam epitaxy) apparatus. At this time, zinc (Zn), cadmium (Cd), and/or aluminum (Al), which are metal materials, were irradiated in a Knudsen cell and supplied onto the substrate. Oxygen (O) and nitrogen (N), which are gaseous materials, were supplied as an oxygen radical (indicated as O*) and a nitrogen radical (indicated as N*), respectively, with a RF radical generator in which $O_2$ gas and NO gas were used as raw materials. The purities of the raw materials were 7N for Zn, 6N for $O_2$, and 5N for NO gas.

Specifically, first, the substrate 12 was heated to 700° C. using a resistance heater, and 3 layers of a quantum well structure composed of $ZnO/Cd_{0.2}Zn_{0.80}$ layers were formed to provide the light emitting layer 14c' having a multiple quantum well structure (MQW). At this time, the film thickness of the ZnO layer was 10 nm, and the film thickness of the $Cd_{0.2}Zn_{0.8}O$ layer was 1.5 nm.

On the light emitting layer 14c' obtained in this way, the p-type ZnO layer 14a' composed of N-doped ZnO was stacked. Specifically, the substrate 12 was heated to 700° C. using a resistance heater, and a film of the N-doped ZnO layer having a thickness of 100 nm was formed, with the flux of the gas sources such that the nitrogen concentration in the film was $1 \times 10^{20}$ cm$^{-3}$.

(2b) Film Formation of Reflective-layer-cum-electrode

A 300 nm Al film was formed into a planar shape as the electrode 16' by an electron beam evaporation method on the p-type ZnO layer 14a'. The electrode of this example was an Al thin film and was configured to function also as a reflective layer for reflecting ultraviolet light.

(2c) Film Formation of Phosphor

In order to form the phosphor layer 17' on the opposite side of the substrate 12' from the light emitting functional layer 14', about 5 pin of silicone resin in which $(Ca,Sr)_5(PO_4)_3Cl:Eu$, $BaMgAl_{10}O_{17}:Eu,Mn$, and $Y_2O_3S:Eu$ were dispersed as phosphor components was applied.

(2d) Evaluation of Light-emitting Device

When current was applied between the substrate 12' and the p-type electrode 16' to perform I-V measurement, rectifying characteristics were confirmed, and it was thus verified that a p-n junction of good quality was formed. Moreover, emission of white light was observed from the entire phosphor layer region. When the emission wavelength was measured after removing the phosphor, emission of ultraviolet having about 390 nm was observed, and it was thus verified that ultraviolet emitted from the p-n junction part was converted into visible light at the phosphor layer.

Example 4

On an Al-doped ZnO oriented sintered body substrate, a buffer layer 13 composed of an n-type Si-doped GaN layer was prepared, and, further, an n-type Si-dope GaN layer and a p-type Mg-doped GaN layer were prepared as a light emitting functional layer, to prepare and evaluate a surface light-emitting device. Since some aspects of the structure of the light-emitting device prepared in this example are similar to the structure shown in FIG. 3, common parts are suitably referred to by the reference numbers found in FIG. 3.

(a) Film formation of buffer layer 13 and light emitting functional layer Films of the buffer layer 13 and the light emitting functional layer 14' were formed on the Al-doped ZnO oriented sintered body substrate 12' obtained in (1b) of Example 3using a RS-MBE (radical source molecular beam epitaxy) apparatus. At this time, gallium (Ga), silicon (Si), and/or magnesium (Mg), which are metal materials, were irradiated in a Knudsen cell and supplied onto the substrate. Nitrogen (N), which is a gaseous material, was supplied as a nitrogen radical with a RF radical generator in which $NH_3$ gas was used as a raw material. The purities of the raw materials were 7N for the respecive metal materials, and 5N for $NH_3$ gas.

Specifically, a Si-doped GaN layer was prepared as the buffer layer 13. First, the substrate was heated to 550° C. using a resistance heater, and a 50 nm thick Si-doped GaN layer film was formed with the flux of the gas sources being controlled such that the Si concentration in the film was $5 \times 10^{18}/cm^3$ and that the ratio of the total atomic concentration of Ga and Si to the total N concentration was 1 to 1. Thereafter, the temperature was raised to 800° C. using a resistance heater, a 600 run thick Si-doped GaN layer film was formed on the 50 mu Si-doped GaN layer with the flux of the gas sources being controlled such that the Si concentration in the film was $5 \times 10^{18}/cm^3$ and that the ratio of the total atomic concentration of Ga and Si to the N concentration was 1 to 1. The Si-doped GaN layer having 650 nm in total obtained in this way was regarded as a buffer layer 13 for suppressing the reaction between the Al-doped ZnO oriented sintered body substrate and the light emitting functional layer and inducing epitaxial growth.

On the buffer layer 13 obtained in this way, a Si-doped GaN layer was prepared as an n-type layer. Specifically, the substrate was heated to 750° C. using a resistance heater, and a 700 nm thick Si-doped GaN layer film was formed with the flux of the gas sources being controlled such that the Si concentration in the film was $5 \times 10^{18}/cm^3$ and that the ratio of the total atomic concentration of Ga and Si to the N concentration was 1 to 1.

On the Si-doped GaN layer obtained in this way, a Mg-doped GaN layer was prepared as a p-type layer. Specifically, the substrate was heated to 750° C. using a resistance heater, and a 200 nm thick Mg-doped GaN layer film was formed with the flux of the gas sources being controlled such that the Mg concentration in the film was $1 \times 10^{19}/cm^3$ and that the ratio of the total atomic concentration of Ga and Mg to the N concentration was 1 to 1.

(b) Film Formation of Reflective-layer-cum-electrode

An Al film was formed into a planar shape on the p-type layer so as to have a thickness of 300 nm as the p-type electrode 16' by an electron beam evaporation method. The electrode of this example was an Al thin film and was configured to function also as a reflective layer for reflecting ultraviolet light.

(c) Film Formation of Phosphor

In order to form the phosphor layer 17' on the opposite side of the substrate 12' from the light emitting functional layer 14', about 5 μm of silicone resin in which $(Ca,Sr)_5(PO_4)_3Cl{:}Eu$, $BaMgAl_{10}O_{17}{:}Eu,Mn$, and $Y_2O_3S{:}Eu$ were dispersed as phosphor components was applied.

(d) Evaluation of Light-emitting Device

When current was applied between the substrate 12' and the p-type electrode 16' to perform I-V measurement, rectifying characteristics were confirmed, and it was thus verified that a p-n junction of good quality was formed. Moreover, emission of white light was observed from the entire phosphor layer region. When the emission wavelength was measured after removing the phosphor, emission of ultraviolet having about 380 nm was observed, and it was thus verified that ultraviolet emitted from the p-n junction part was converted into visible light at the phosphor layer.

Although this example adopted a structure in which the phosphor layer 17' was prepared on the side of the substrate 12' opposite to the light emitting functional layer so as to allow light to be emitted through the substrate 12', a structure can also be made in which large openings (light extraction openings) are ensured in the p-type electrode 16', and a phosphor layer is provided on the p-type electrode 16' while a reflective layer is provided on the opposite side of the substrate 12' from the light emitting functional layer 14'. In this way, light can be extracted from the light emitting functional layer 14' side relative to the substrate 12'.

Example 5

On an Al-doped ZnO oriented sintered body substrate, a buffer layer 13 composed of an n-type Si-doped GaN layer was prepared, and, further, an n-type Si-dope GaN layer and a p-type Mg-doped GaN layer were prepared as a light emitting functional layer, to prepare and evaluate a surface light-emitting device. Since some aspects of the structure of the light-emitting device prepared in this example are similar to the structure shown in FIG. 3, common parts are suitably referred to by the reference numbers found in FIG. 3. That is, a surface light-emitting device having a structure similar to the above-described structure shown in FIG. 3 was prepared using a translucent oriented zinc oxide sintered body as a substrate as follows.

(1) Preparation and Evaluation of Al-doped ZnO Oriented Sintered Body Substrate (1a) Preparation of Plate-like Zinc Oxide Powder An Al-doped (002) plane-oriented ZnO powder was prepared in the same manner as in (1a) of Example 2 except that the ratio was adjusted to be zinc:aluminum=100:2 (atomic ratio).

(1b) Shaping and Firing Steps 100 parts by weight of the resulting plate-like zinc oxide particles were mixed with 15 parts by weight of a binder (polyvinyl butyral: Part No. BM-2, manufactured by Sckisui Chemical Co., Ltd.), 10 parts by weight of a plasticizer (DOP: di(2-ethylhexyl)phthalate, manufactured by Kurogane Kasei Co., Ltd.), 3 parts by weight of a dispersant (trade name: Rheodol SP-030, manufactured by Kao Corporation), and a dispersion medium (2-ethylhexanol). The amount of the dispersion medium was adjusted to provide a slurry viscosity of 10000 cP. The slurry thus prepared was applied to a PET film by a doctor blade method to form a sheet having a thickness after drying of 20 μm. The resulting tape was cut into 20×20 mm sheet, and 500 pieces of the cut tape were stacked, placed on an aluminum plate having a thickness of 10 mm, and then vacuum-packed. This vacuum pack was subjected to isostatic pressing in hot water at 85° C. under a pressure of 100 kgf/cm² to prepare a green body in a plate shape. The resulting green body was placed in a degreasing furnace and degreased under 600° C., and 20 hour conditions. The resulting degreased body was fired at atmospheric pressures under 1400° C., and 5 hour conditions in nitrogen to prepare a ZnO oriented sintered body substrate in a plate shape.

(1c) Evaluation of Sintered Body Substrate

The resulting ZnO sintered body substrate was evaluated as in (1c) of Example 1. As a result, the degree of (002) orientation of the sintered body substrate was 86%, the average grain diameter of sintered grains was 8 µm, and the volume resistivity was $1\times10^{-3}$ Ω·cm.

(2) Preparation and Evaluation of Surface Light-emitting Device

A buffer layer 13, a light emitting functional layer 14', a reflective-layer-cum-electrode 16', and a phosphor layer 17' were formed on the ZnO oriented sintered body substrate 12' obtained above to prepare a surface light-emitting device 10'. The methods for forming the respective layers were as follows.

(2a) Film formation of buffer layer 13 and light emitting functional layer Films of the buffer layer 13 and the light emitting functional layer 14' were formed on the Al-doped ZnO oriented sintered body substrate 12' obtained in (1b) above using an MOCVD (metal organic chemical vapor deposition) apparatus. As for the raw material gas, TMG (trimethylgallium) was used as a Ga source, NH₃ (ammonia) as a N source, Cp₂Mg (magnesium cyclopentadienyl) as a Mg source, and SiH₄ (monosilane) as a Si source.

Specifically, a Si-doped GaN layer was prepared as the buffer layer 13. First, the Al-doped ZnO oriented sintered body substrate 12' was placed in an MOCVD furnace (metal organic chemical vapor deposition furnace), and a 50 nm thick Si-doped GaN layer film was formed at 700° C. in a nitrogen gas atmosphere inside the furnace using TMG, NH₃, and SiH₄ as raw materials, with the bubbling amount of the gas sources being controlled such that the Si concentration in the film was $2\times10^{18}$/cm³ and that the ratio of the total atomic concentration of Ga and Si to the total N concentration in the raw material gas was 1:3000. Thereafter, the temperature was raised to 800° C., and a 600 nm thick Si-doped GaN layer film was formed on the 50nm Si-doped GaN layer with the bubbling amount of the gas sources being controlled such that the Si concentration in the film was $2\times10^{18}$/cm³ and that the ratio of the total atomic concentration of Ga and Si to the total N concentration in the furnace was 1:3000. The Si-doped GaN layer having total 650 nm obtained in this way was regarded as a buffer layer 13 for suppressing the reaction between the Al-doped ZnO oriented sintered body substrate and the light emitting functional layer and inducing epitaxial growth.

On the buffer layer 13 obtained in this way, a Si-doped GaN layer was prepared as an n-type layer. Specifically, the substrate temperature was raised to 1100° C. in a hydrogen-nitrogen mixed atmosphere, and a 2 µm thick Si-doped GaN layer film was formed with the bubbling amount of the gas sources being controlled such that the Si concentration in the film was $2\times10^{18}$/cm³ and that the ratio of the total atomic concentration of Ga and Si to the total N concentration in the raw material gas was 1 to 2000, using TMG, NH₃, and SiH₄ as raw materials.

On the n-type layer obtained in this way, a Mg-doped GaN layer was prepared as a p-type layer. Specifically, a 0.1 µm thick Mg-doped GaN layer film was formed at 1100° C. in a hydrogen-nitrogen mixed atmosphere using TMG, NH₃, and Cp₂Mg as raw materials, with the bubbling amount of the gas sources being controlled such that the Mg concentration in the film was $1\times10^{19}$ cm⁻³ and that the ratio of the total atomic concentration of Ga and Mg to the total N concentration in the raw material gas was 1 to 1500. After the film formation, the temperature was lowered to room temperature in a nitrogen atmosphere, and the substrate 12' on which the buffer layer 13 and the light emitting functional layer 14' were formed was taken out.

Subsequently, in order to activate the Mg-doped GaN layer as p-type, the substrate 12' was placed in a rapid thermal anneal furnace (RTA), heated from room temperature to 800° C. in 5 minutes in a nitrogen atmosphere, kept at this temperature for 2 minutes, then cooled to room temperature, and taken out.

(2b) Film Formation of Reflective-layer-cum-electrode

An Al film was formed into a planar shape on the p-type layer of the substrate 12' so as to have a thickness of 300 nm as the p-type electrode 16' by an electron beam evaporation method. The electrode of this example was an Al thin film and was configured to function also as a reflective layer for reflecting ultraviolet light.

(2c) Film Formation of Phosphor

In order to form the phosphor layer 17' on the opposite side of the substrate 12' from the light emitting functional layer 14', about 5 µm of silicone resin in which $(Ca,Sr)_5(PO_4)_3Cl$:Eu, $BaMgAl_{10}O_{17}$:Eu,Mn, and $Y_2O_3S$:Eu were dispersed as phosphor components was applied.

(2d) Evaluation of Light-emitting Device

When current was applied between the substrate 12' and the p-type electrode 16' to perform I-V measurement, rectifying characteristics were confirmed, and it was thus verified that a p-n junction of good quality was formed. Moreover, emission of white light was observed from the entire phosphor layer region. When the emission wavelength was measured after removing the phosphor, emission of ultraviolet having about 380 nm was observed, and it was thus verified that ultraviolet emitted from the p-n junction part was converted into visible light in the phosphor layer. In this way, the use of an Al-doped ZnO oriented sintered body for a substrate makes it possible to form a light emitting functional layer film while suppressing the reaction between a reducing atmosphere and the ZnO oriented sintered body as well as the influence of the resulting evaporation even in MOCVD in which a high-temperature reducing atmosphere is used.

Although this example adopt a structure in which the phosphor layer 17' was prepared on the side of the substrate 12' opposite to the light emitting functional layer so as to allow light to be emitted through the substrate 12', a structure can also be made in which large openings (light extraction openings) are ensured in the p-type electrode 16', and a phosphor layer is provided on the p-type electrode 16', while a reflective layer is provided on the opposite side of the substrate 12' from the light emitting functional layer 14'. In this way, light can be extracted from the light emitting functional layer 14' side relative to the substrate 12'.

The invention claimed is:
1. A surface light-emitting device comprising:
a substrate composed of an oriented polycrystalline zinc oxide sintered body in a plate shape;
a light emitting functional layer provided on the substrate; and an electrode provided on the light emitting functional layer;

wherein zinc oxide single crystal grains constituting the oriented polycrystalline zinc oxide sintered body have an average grain diameter of 1 to 100 μm, and wherein the oriented polycrystalline zinc oxide sintered body has an orientation in the (002) plane, (110) plane, or (101) plane.

2. The surface light-emitting device according to claim 1, wherein the light emitting functional layer has a structure epitaxially grown in conformity with an orientation of the oriented polycrystalline zinc oxide sintered body, and thereby has a crystal orientation aligned in a normal direction.

3. The surface light-emitting device according to claim 1, further comprising a buffer layer between the light emitting functional layer and the substrate.

4. The surface light-emitting device according to claim 1, wherein the oriented polycrystalline zinc oxide sintered body has a degree of orientation of 50% or greater to 100% or less.

5. The surface light-emitting device according to claim 1, wherein the oriented polycrystalline zinc oxide sintered body has a degree of orientation of 65% or greater to 100% or less.

6. The surface light-emitting device according to claim 1, wherein the oriented polycrystalline zinc oxide sintered body has a degree of orientation of 75% or greater to 100% or less.

7. The surface light-emitting device according to claim 1, wherein the oriented polycrystalline zinc oxide sintered body is doped with an n-type dopant.

8. The surface light-emitting device according to claim 7, wherein the n-type dopant comprises one or more selected from the group consisting of aluminum (Al), gallium (Ga), indium (In), boron (B), fluorine (F), chlorine (Cl), bromine (Br), iodine (I), and silicon (Si).

9. The surface light-emitting device according to claim 1, wherein the oriented polycrystalline zinc oxide sintered body is doped with a p-type dopant.

10. The surface light-emitting device according to claim 9, wherein the p-type dopant comprises one or more selected from the group consisting of nitrogen (N), phosphorus (P), arsenic (As), carbon (C), lithium (Li), sodium (Na), potassium (K), silver (Ag), and copper (Cu).

11. The surface light-emitting device according to claim 1, wherein the oriented polycrystalline zinc oxide sintered body has a resistivity of $8\times10^{-4}$ Ωcm or greater to $1\times10^{-2}$ Ωcm or less.

12. The surface light-emitting device according to claim 1, wherein the oriented polycrystalline zinc oxide sintered body has a resistivity of $8\times10^{-4}$ Ωcm or greater to $1\times10^{-3}$ Ωcm or less.

13. The surface light-emitting device according to claim 1, wherein the light emitting functional layer has a light emitting function based on a p-n junction.

14. The surface light-emitting device according to claim 1, wherein the light emitting functional layer is composed of at least one selected from zinc oxide-based materials, gallium nitride-based materials, aluminum nitride-based materials, copper oxide-based materials, nickel oxide-based materials, zinc telluride-based materials, and zinc sulfide-based materials.

15. The surface light-emitting device according to claim 1, wherein the substrate has an area of 25 cm² or greater to 400 cm² or less.

16. The surface light-emitting device according to claim 1, wherein the oriented polycrystalline zinc oxide sintered body has a resistivity of $8\times10^{-4}$ Ωcm or greater to $1\times10^{-1}$ Ωcm or less.

* * * * *